United States Patent
Sandhu

(10) Patent No.: US 9,691,817 B2
(45) Date of Patent: Jun. 27, 2017

(54) MAGNETIC TUNNEL JUNCTIONS AND METHODS OF FORMING MAGNETIC TUNNEL JUNCTIONS

(71) Applicant: Micron Technology, Inc., Boise, ID (US)

(72) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/989,556

(22) Filed: Jan. 6, 2016

(65) Prior Publication Data

US 2016/0118439 A1     Apr. 28, 2016

Related U.S. Application Data

(62) Division of application No. 14/023,138, filed on Sep. 10, 2013, now Pat. No. 9,240,547.

(51) Int. Cl.
*H01L 27/22* (2006.01)
*H01L 43/12* (2006.01)
(Continued)

(52) U.S. Cl.
CPC ............ *H01L 27/222* (2013.01); *H01L 29/82* (2013.01); *H01L 43/02* (2013.01); *H01L 43/08* (2013.01); *H01L 43/12* (2013.01)

(58) Field of Classification Search
CPC ....... H01L 43/02; H01L 27/22; H01L 27/222; H01L 29/82
See application file for complete search history.

(56) References Cited

U.S. PATENT DOCUMENTS 5,640,343 A    6/1997 Gallagher et al.
5,898,548 A    4/1999 Dill
(Continued)

FOREIGN PATENT DOCUMENTS

EP    1484347.7    3/2017
JP    2008-034857  2/2008
(Continued)

OTHER PUBLICATIONS

U.S. Appl. No. 14/746,421, filed Jun. 22, 2015, Chen et al.
(Continued)

*Primary Examiner* — Joseph C Nicely
(74) *Attorney, Agent, or Firm* — Wells St. John, P.S.

(57) ABSTRACT

A method of forming a line of magnetic tunnel junctions includes forming magnetic recording material over a substrate, non-magnetic material over the recording material, and magnetic reference material over the non-magnetic material. The substrate has alternating outer regions of reactant source material and insulator material along at least one cross-section. The reference material is patterned into a longitudinally elongated line passing over the alternating outer regions. The recording material is subjected to a set of temperature and pressure conditions to react with the reactant of the reactant source material to form regions of the dielectric material which longitudinally alternate with the recording material along the line and to form magnetic tunnel junctions along the line which individually comprise the recording material, the non-magnetic material, and the reference material that are longitudinally between the dielectric material regions. Other methods, and lines of magnetic tunnel junctions independent of method, are disclosed.

8 Claims, 7 Drawing Sheets

(51) Int. Cl.
*H01L 43/02* (2006.01)
*H01L 29/82* (2006.01)
*H01L 43/08* (2006.01)

(56) References Cited

U.S. PATENT DOCUMENTS

| | | |
|---|---|---|
| 5,949,600 A | 9/1999 | Akiyama |
| 5,994,899 A | 11/1999 | Mohri |
| 6,048,632 A | 4/2000 | Solin |
| 6,538,921 B2 | 3/2003 | Daughton |
| 6,600,184 B1 | 7/2003 | Gill |
| 6,788,502 B1 | 9/2004 | Gill |
| 7,324,313 B2 | 1/2008 | Childress |
| 7,595,520 B2 | 9/2009 | Horng et al. |
| 7,629,637 B2 | 12/2009 | Kajiyama et al. |
| 7,660,153 B2 | 2/2010 | Yamane et al. |
| 7,944,738 B2 | 5/2011 | Liu et al. |
| 7,981,697 B2 | 7/2011 | Wang |
| 8,102,700 B2 | 1/2012 | Liu et al. |
| 8,218,357 B2 | 7/2012 | Liu et al. |
| 8,310,861 B2 | 11/2012 | Liu et al. |
| 8,553,450 B2 | 10/2013 | Hosotani et al. |
| 8,559,141 B1 | 10/2013 | Pakala |
| 8,836,056 B2 | 9/2014 | Oguz et al. |
| 8,842,465 B2 | 9/2014 | Yamane et al. |
| 9,099,124 B1 | 8/2015 | Freitag |
| 9,177,573 B1 | 11/2015 | Oh |
| 2002/0153580 A1 | 10/2002 | Hosotani et al. |
| 2003/0206379 A1 | 11/2003 | Lin |
| 2004/0057295 A1 | 3/2004 | Matsukawa et al. |
| 2004/0179395 A1 | 9/2004 | Tsang |
| 2005/0006682 A1 | 1/2005 | Bae et al. |
| 2005/0247964 A1 | 11/2005 | Pietambaram et al. |
| 2005/0254289 A1 | 11/2005 | Nakajima et al. |
| 2006/0017081 A1 | 1/2006 | Sun et al. |
| 2007/0064350 A1 | 3/2007 | Gill |
| 2007/0064352 A1 | 3/2007 | Gill |
| 2007/0096229 A1 | 5/2007 | Yoshikawa |
| 2007/0217075 A1* | 9/2007 | Kamata ............... B82Y 10/00 360/135 |
| 2007/0243638 A1 | 10/2007 | Horng et al. |
| 2008/0144234 A1 | 6/2008 | Lin |
| 2008/0164548 A1 | 7/2008 | Ranjan |
| 2008/0182015 A1 | 7/2008 | Parkin |
| 2009/0046397 A1 | 2/2009 | Sun et al. |
| 2009/0161422 A1 | 6/2009 | Zhu |
| 2010/0006960 A1 | 1/2010 | Horng et al. |
| 2010/0080894 A1 | 4/2010 | Tsunekawa |
| 2011/0062538 A1 | 3/2011 | Rizzo et al. |
| 2011/0149646 A1 | 6/2011 | Liu et al. |
| 2011/0318848 A1 | 12/2011 | Choi |
| 2012/0056285 A1 | 3/2012 | Bessho et al. |
| 2012/0068139 A1 | 3/2012 | Daibou |
| 2012/0087179 A1 | 4/2012 | Jung |
| 2012/0127603 A1 | 5/2012 | Gao |
| 2012/0193216 A1 | 8/2012 | Endo |
| 2012/0241879 A1 | 9/2012 | Ikeno et al. |
| 2012/0286382 A1 | 11/2012 | Jan et al. |
| 2013/0004796 A1* | 1/2013 | Peng .................... G11B 5/66 428/827 |
| 2013/0037862 A1* | 2/2013 | Kitagawa ............. H01L 43/08 257/252 |
| 2013/0071954 A1 | 3/2013 | Zhou |
| 2013/0148418 A1 | 6/2013 | Luo et al. |
| 2013/0177781 A1 | 7/2013 | Chepulskyy et al. |
| 2013/0181305 A1 | 7/2013 | Nakayama et al. |
| 2013/0187247 A1 | 7/2013 | Wu et al. |
| 2013/0224521 A1 | 8/2013 | Wang et al. |
| 2013/0236639 A1 | 9/2013 | Carey |
| 2013/0241015 A1 | 9/2013 | Nomachi |
| 2013/0307097 A1 | 11/2013 | Yi et al. |
| 2014/0027869 A1 | 1/2014 | Lee et al. |
| 2014/0038314 A1 | 2/2014 | Zhou |
| 2014/0084401 A1 | 3/2014 | Kato |
| 2014/0117477 A1* | 5/2014 | Park ................. H01L 27/228 257/421 |
| 2014/0131649 A1 | 5/2014 | Daibou et al. |
| 2014/0145792 A1 | 5/2014 | Wang et al. |
| 2014/0175581 A1 | 6/2014 | Guo |
| 2014/0203383 A1 | 7/2014 | Guo |
| 2014/0248719 A1 | 9/2014 | Zhou et al. |
| 2014/0269033 A1 | 9/2014 | Natori et al. |
| 2014/0284742 A1 | 9/2014 | Sawada et al. |
| 2014/0287537 A1 | 9/2014 | Shukh |
| 2015/0069562 A1 | 3/2015 | Sandhu |
| 2015/0076633 A1 | 3/2015 | Siddik et al. |
| 2015/0102439 A1 | 4/2015 | Gan et al. |
| 2015/0137289 A1 | 5/2015 | Khalili-Amiri |
| 2015/0280113 A1 | 10/2015 | Tan |
| 2016/0105176 A1 | 4/2016 | Miura |
| 2016/0254445 A1 | 9/2016 | Tahmasebi |

FOREIGN PATENT DOCUMENTS

| | | |
|---|---|---|
| JP | 2012-519957 | 8/2012 |
| JP | 2012-204432 | 10/2012 |
| JP | 2013-140891 | 7/2013 |
| JP | 2010-034153 | 7/2016 |
| KR | 10-2008-0084590 | 9/2008 |
| KR | 10-2015-0031311 | 3/2015 |
| WO | WO 2014/022304 | 2/2014 |
| WO | PCT/US2014/047572 | 10/2014 |
| WO | PCT/US2015/061568 | 2/2016 |
| WO | PCT/US2014/047572 | 3/2016 |
| WO | PCT/US2016/018045 | 5/2016 |
| WO | PCT/US2016/018015 | 6/2016 |
| WO | PCT/US2016/018077 | 6/2016 |
| WO | PCT/US2016/014259 | 7/2016 |
| WO | PCT/US2016/24219 | 7/2016 |

OTHER PUBLICATIONS

U.S. Appl. No. 15/154,033, filed May 13, 2016, Chen et al.
Marakov, A.; Chapter 4: Magnetoresistive Memory; Dissertation—Modeling of Emerging Resistive Switching Based Memory Cells; Apr. 4, 1985; 11 pp.
Sbiaa et al.; Materials with perpendicular magnetic anisotropy for magnetic random access memory; Phys. Status Solidi RRL 5, No. 12; 2011; pp. 413-419.
U.S. Appl. No. 14/563,303, filed Dec. 8, 2014, Chen et al.
U.S. Appl. No. 14/684,110, filed Apr. 10, 2015, Sandhu.
U.S. Appl. No. 14/687,280, filed Apr. 15, 2015, Siddik et al.
U.S. Appl. No. 14/687,317, filed Apr. 15, 2015, Siddik.
U.S. Appl. No. 14/704,023, filed May 5, 2015, Siddik.
U.S. Appl. No. 14/706,182, filed May 7, 2015, Harms.
Annealing influence on the Gilbert damping parameter and the exchange constant of CoFeB thin films; Conca et al.; Applied Physics Letter 104; May 8, 2014; pp. 182407-1-182401-4.
Annealing of CoFeB/MgO based single and double barrier magnetic tunnel junctions: Tunnel magnetoresistance, bias dependence, and output voltage; Feng et al; Journal of Applied Physics, vol. 105, Feb. 11, 2009; pp. 033916-1 to 033916-7.
Atomic and Electronic Structure of CoFeB/MgO Interface from First Principles; Burton et al.; Applied Physics Letters, vol. 89; Oct. 5, 2006; pp. 142507-1 to 142507-3.
Boron diffusion in magnetic tunnel junctions with MgO (001) barriers and CoFeB electrodes; Kurt et al.; Applied Physics Letters, vol. 96; Jun. 28, 2010; pp. 262501-1 to 262501-3.
Boron diffusion induced symmetry reduction and scattering in CoFeB/MgO/CoFeB magnetic tunnel junctions; Bai et al.; The American Physical Society; Physical Review B, vol. 87; Jan. 23, 2013; pp. 014114-1 to 014114-6.
Boron migration due to annealing in CoFeB/MgO/CoFeB interfaces: A combined hard x-ray photoelectron spectroscopy and x-ray absorption studies; Rumaiz et al.; Applied Physics Letters, vol. 99; Nov. 28, 2011; pp. 222502-1 to 222502-3.
Boron segregation in crystallized MgO/amorphous-Co 40 Fe 40 B 20 Co 40 Fe 40 B 20 Co 40 Fe 40 B 20 thin films; You et al.; Journal of Applied Physics, vol. 104, Aug. 5, 2008; pp. 033517-1 to 033517-6.

(56) References Cited

OTHER PUBLICATIONS

Comparative material issues for fast reliable switching in STT-RAMs; Munira et al.; 2011 11th IEEE International Conference on Nanotechnology; Aug. 15-18, 2012; pp. 1403-1408.

Comparison of Synthetic Antiferromagnets and Hard Ferromagnets as Reference Layer in Magnetic Tunnel Junctions With Perpendicular Magnetic Anisotropy; Bandiera et al.; Spin Electronics; IEE Magnetics Letters, vol. 1; Jul. 8, 2010; 4 pp.

Damping of CoxFe80-xB20 ultrathin films with perendicular magnetic anisotropy; Devolder et al.; Applied Physics Letters 103; Jan. 15, 2013; pp. 022407-1-022407-4.

Exchange coupling of bilayers and synthetic antiferromagnets pinned to MnPt; Rickart et al.; The European Physical Journal B; Mar. 8, 2005; pp. 1-6.

Giant tunnelling magnetoresistance at room temperature with MgO (100) tunnel barriers; Parkin et al.; nature materials, vol. 3; Oct. 31, 2004; pp. 862-867.

Magnetic Tunnel Junctions; Zhu et al.; Materialstoday; vol. 9, No. 11; Nov. 2006; pp. 36-45.

Magnetoresistive Random-Access Memory; www.wikipedia.org/wiki/RAM; As downloaded from the Internet Jul. 28, 2013; 10 pp.

MgO barrier-perpendicular magnetic tunnel junctions with CoFe/Pd multilayers and ferromagnetic insertion layers; Mizunuma et al.; Laboratory for Nanoelectronics and Spintronics, Research Institute of Electrical Communication, Tohoku University; Advanced Research Laboratory, Hitachi, Ltd.; Dec. 11, 2009; 17 pp.

Microstructure and magnetic properties of FeCoN thin films; Kuo et al.; Journal of Applied Physics, vol. 83, No. 11; Jun. 1, 1998; pp. 6643-6645.

On the role of Ta cap in the recrystallization process of CoFeB layers; Bouchikhaoui et al.; Applied Physics Letters, vol. 103; Oct. 3, 2013; pp. 142412-1 to 142412-5.

Spin Pumping and Spin Transfer; Brataas et al.; arXiv:1108.0385v3[cond-ma.tmes-hall]; Mar. 6, 2012; pp. 1-30.

Spin-dependent tunneling conductance of FezMgOzFe sandwiches; Butler et al.; The American Physical Society; Physical Review B, vol. 63; Jan. 8, 2001; pp. 054416-1 to 054416-12.

Spin-Transfer Torque; www.wikipedia.org/wiki/Spin-transfer_torque; As downloaded from the Internet Aug. 2, 2013; 2 pp.

Sputtered FeCoN Soft Magnetic Thin Films With High Resistivity; Jiang et al.; IEEE Transactions on Magnetics, vol. 39, No. 6; Nov. 2003; pp. 3559-3562.

Status and Challenges for Non-Volatile Spin-Transfer Torque RAM (STT-RAM); Krounbi et al.; International Symposium on Advanced Gate Stack-Technology; Sep. 23, 2010; 28 pp.

Theory of tunneling magnetoresistance of an epitaxial FeÕMgOÕFe/001 junction; Manthan et al.; The American Physical Society; Physical Review B, vol. 63; May 10, 2001; pp. 220403-1 to 220403-4.

Tunnel Magnetoresistance; www.wikipedia.org/wiki/tunnel_manetoresistance; As downloaded from the Internet Jul. 28, 2013; 5 pp.

Variation in the properties of the interface in a CoFeB/MgO/CoFeB tunnel junction during thermal annealing; Jang et al.; Applied Physics Letters, vol. 91; Sep. 4, 2007; pp. 102104-1 to 102104-3.

Zhang et al.; Large magnetoresistance in bcc Co/MgO/Co and FeCo/MgO/FeCo tunnel junctions; The American Physical Society; Physical Review B, vol. 70; Nov. 17, 2004; pp. 172407-1 to 172407-4.

\* cited by examiner

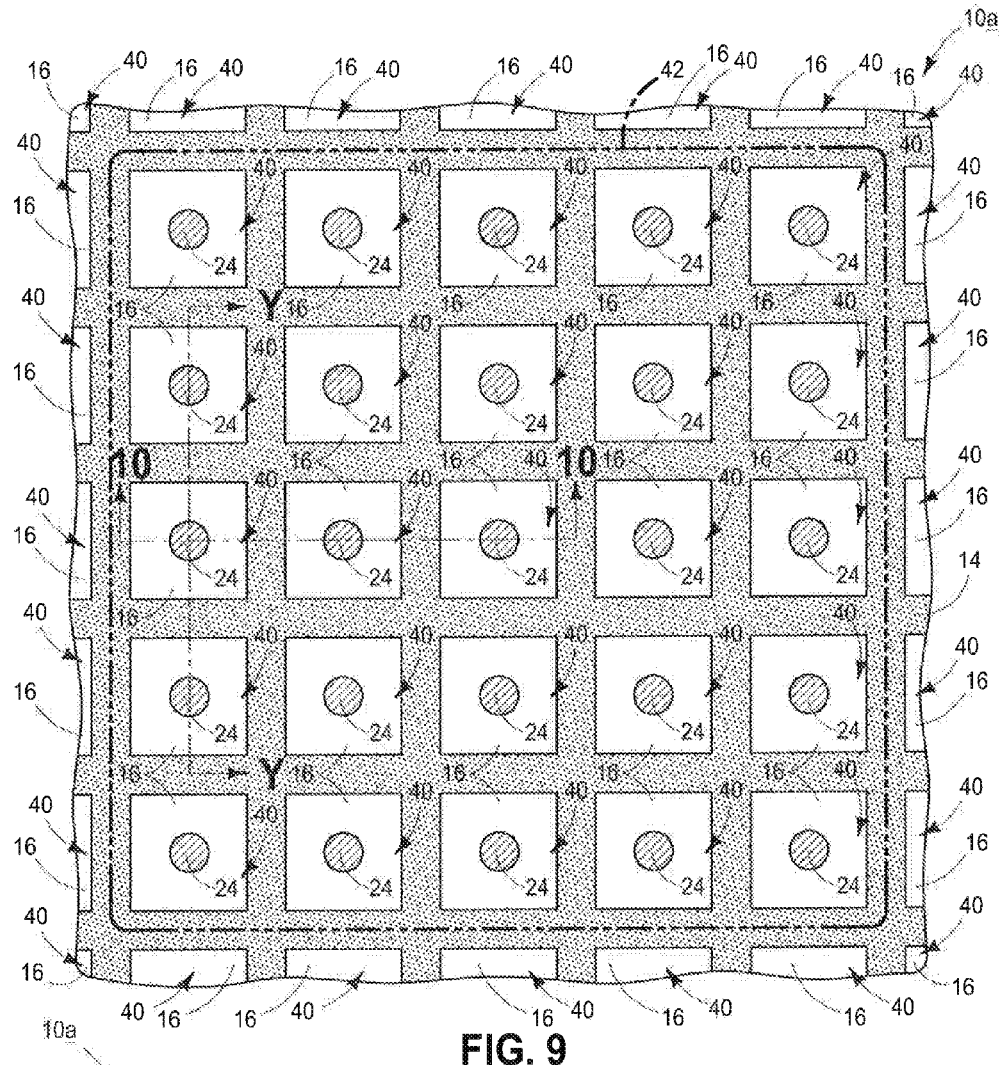
FIG. 9
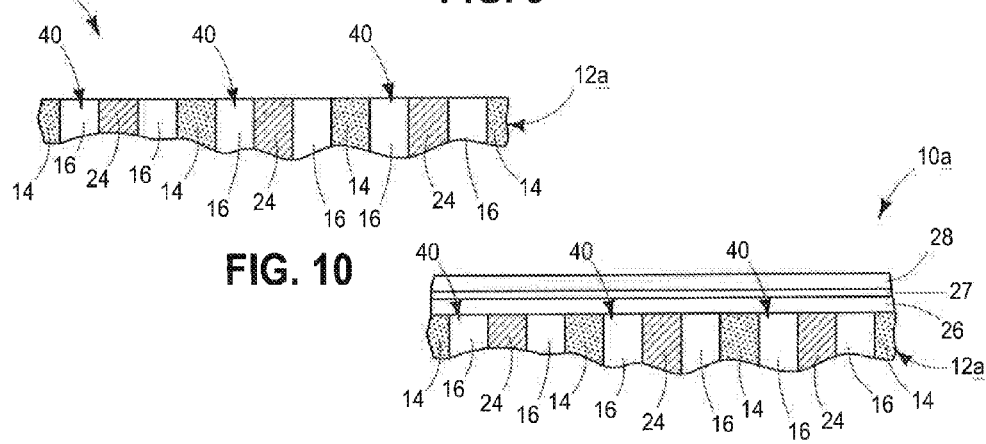
FIG. 10
FIG. 11

MAGNETIC TUNNEL JUNCTIONS AND METHODS OF FORMING MAGNETIC TUNNEL JUNCTIONS

RELATED PATENT DATA

This patent resulted from a divisional application of U.S. patent application Ser. No. 14/023,138, filed Sep. 10, 2013, entitled "Magnetic Tunnel Junctions And Methods Of Forming Magnetic Tunnel Junctions", naming Gurtej S. Sandhu as inventor, the disclosure of which is incorporated by reference.

TECHNICAL FIELD

Embodiments disclosed herein pertain to magnetic tunnel junctions and to methods of forming magnetic tunnel junctions.

BACKGROUND

A magnetic tunnel junction is an integrated circuit component having two magnetic materials separated by a thin non-magnetic dielectric material. The dielectric material is sufficiently thin such that electrons can tunnel from one magnetic material to the other through the dielectric material under appropriate conditions. At least one of the magnetic materials is ferromagnetic whereby its magnetic domain direction can be switched between two states, and is commonly referred to as the "free" or "recording" material. The other material may not be ferromagnetic, and may commonly be referred to as the "reference" or "fixed" material. The reference material and the recording material are electrically coupled to respective conductive nodes. The resistance of current flow between those two nodes through the reference material, dielectric material, and recording material is dependent upon the magnetic domain direction of the recording material relative to that of the reference material. Accordingly, a magnetic tunnel junction can be programmed into one of at least two states, and those states can be sensed by measuring current flow through the magnetic tunnel junction. Since magnetic tunnel junctions can be "programmed" between two current-conducting states, they have been proposed for use in memory integrated circuitry. Additionally, magnetic tunnel junctions may be used in logic or other circuitry apart from or in addition to memory.

The magnetic domain direction of the recording material can be switched by an external magnetic field or by using a spin-polarized current to result in a spin-transfer torque effect. Charge carriers (such as electrons) have a property known as "spin" which is a small quantity of angular momentum intrinsic to the carrier. An electric current is generally unpolarized (having 50% "spin-up" and 50% "spin-down" electrons). A spin-polarized current is one with more electrons of either spin. By passing a current through magnetic material, one can produce a spin-polarized current. If a spin-polarized current is directed into a ferromagnetic material, angular momentum can be transferred to that material, thereby affecting its orientation. This can be used to excite oscillations or even flip (i.e., switch) the orientation/domain direction of the ferromagnetic material.

Typical existing proposals for magnetic tunnel junctions form the two magnetic materials and non-magnetic material as a pillar, for example that may have circular or rectangular horizontal cross-section. Those configurations are typically created by depositing a stack of the three materials, followed by etching the stack to form a plurality of magnetic tunnel junctions which individually include the three materials. Unfortunately, etching of such materials can cause damage to the sidewalls/edges of the resultant pillars. This damage can be sufficient to adversely affect device operation, particularly as the pillars become smaller and narrower.

BRIEF DESCRIPTION OF THE DRAWINGS

FIG. 9 is a diagrammatic top plan view of a substrate fragment in process in accordance with an embodiment of the invention.

FIG. 10 is a sectional view taken through line 10-10 in FIG. 9.

FIG. 11 is a sectional view of the FIG. 10 substrate at a processing step subsequent to that shown by FIG. 10, and as would be taken through the position of line Y-Y in FIG. 9.

DETAILED DESCRIPTION OF EXAMPLE EMBODIMENTS

Example methods of forming a line or lines of magnetic tunnel junctions in accordance with some embodiments of the invention are initially described with reference to FIGS. 1-8 with respect to a substrate fragment 10, and which may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Any of the materials and/or structures described herein may be homogenous or non-homogenous, and regardless may be continuous or discontinuous over any material which such overlie. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Figure 1:
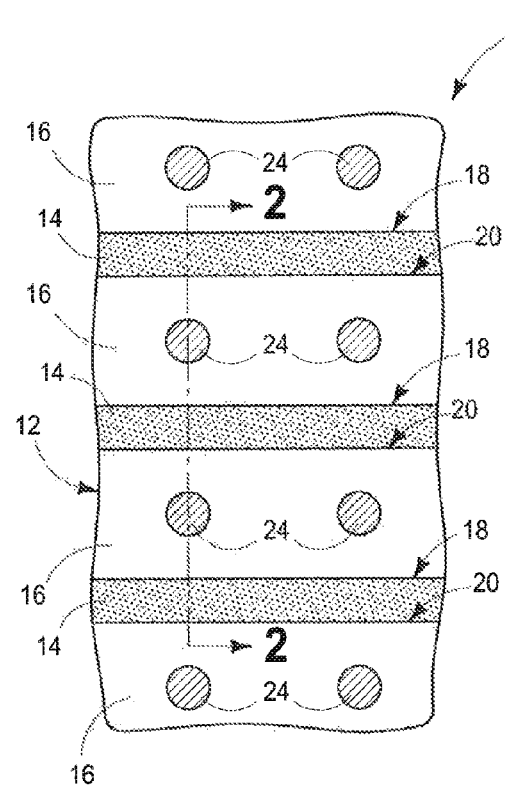
FIG. 1 is a diagrammatic top plan view of a substrate fragment in process in accordance with an embodiment of the invention.
Figure 2:
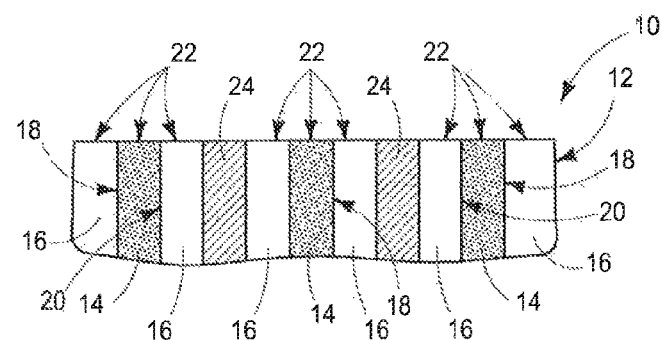
FIG. 2 is a sectional view taken through line 2-2 in FIG. 1.

Referring to FIGS. 1 and 2, substrate fragment 10 comprises a substrate 12 having alternating outer regions 14, 16 (e.g., elevationally outer regions) of reactant source material and insulator material, respectively, along at least one cross-section. FIG. 2 is but one example such cross-section, although other and/or non-straight line cross-sections may apply. In one embodiment and as shown, the alternating outer regions 14 and 16 individually comprise longitudinally elongated and parallel lines 18 and 20, respectively. Alternate configurations may be used, and where lines are used, those lines need not be parallel relative one another nor straight linear. An example non-line configuration is islands of insulator material provided within an expanse (e.g., a "sea") of reactant source material, and as is described in other embodiments below. Regardless, alternating outer regions 14, 16 have elevationally outermost surfaces 22, and which in one embodiment are planar and in one embodiment are co-planar. In one embodiment and as shown, outer regions 14 of reactant source material are laterally narrower than outer regions 16 of insulator material along the cross-section (FIG. 1).

Electrically conductive vias 24 are shown extending through the insulator material of outer regions 16 between immediately adjacent outer regions 14. Vias 24 will individually electrically couple with the magnetic tunnel junctions being formed as will be apparent from the continuing discussion. Conductive vias 24 may be of any suitable configuration, and may be of the same, lesser, or greater maximum lateral dimension as outer regions 14 of the reactant source material. Other partially or wholly fabricated components of integrated circuitry may be formed as a part of or be elevationally inward of vias 24 and the material of outer regions 14, 16 (e.g., CMOS devices and at least one level of interconnections), and are not particularly germane to the inventions disclosed herein.

Figure 3:
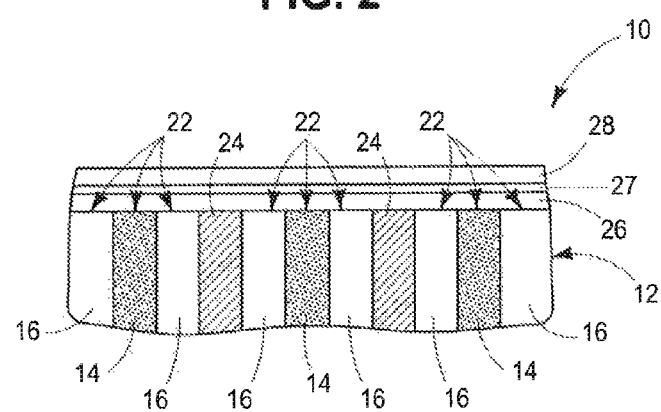
FIG. 3 is a view of the FIG. 2 substrate at a processing step subsequent to that shown by FIG. 2.

Referring to FIG. 3, magnetic recording material 26 has been formed over substrate 12, non-magnetic material 27 has been formed over recording material 26, and magnetic reference material 28 has formed over non-magnetic material 27. Such may comprise the primary materials of the magnetic tunnel junctions being formed. Any existing or yet-to-be-developed compositions and thicknesses may be used for materials 26, 27, and 28. As examples, non-magnetic material 27 may comprise MgO; magnetic reference material 28 may comprise a mixture of cobalt, iron, and boron; and magnetic recording material 26 may comprise a mixture of cobalt, iron, boron, and additional metals/materials (e.g., one or more of Ni, Mg, $CrO_2$, NiMnSb, PtMnSb, $RXMnO_3$ [R: rare earth; X: Ca, Ba, and/or Sr]) whereby at least magnetic material 26 is ferromagnetic. In some embodiments, one or more of materials 26, 27, and 28 are deposited directly against one another, and/or with magnetic recording material 26 being directly against outer regions 14 of reactant source material and/or conductive vias 24.

The reactant source material of outer regions 14 comprises a reactant that will react with magnetic recording material 26 to form dielectric material when subjected to a set of temperature and pressure conditions. Ideally, the insulator material of outer regions 16 is not reactive with magnetic recording material 26 to form such dielectric material when subjected to the set of temperature and pressure conditions, or at least is not as reactive with magnetic recording material 26 as is the reactant source material. In one embodiment, the set of temperature and pressure conditions are ambient room temperature to about 350° C., and greater than about 10 Torr, respectively (in argon gas, for example). In one embodiment, temperature of the set of temperature and pressure conditions is at least 50° C. In one embodiment, the reactant comprises oxygen (i.e., elemental oxygen and/or oxygen-containing radicals, ions, molecules, etc.), for example to form dielectric metal oxide(s). Specific example such reactant source materials include at least one of silicon dioxide and an aluminum oxide. In one embodiment, the reactant comprises nitrogen (i.e., elemental nitrogen and/or nitrogen-containing radicals, ions, molecules, etc.), for example to form dielectric metal nitride(s). Specific example such reactant source materials include at least one of a silicon nitride and a boron nitride.

In one embodiment, the reactant source material comprises one of a dielectric nitride and a dielectric oxide, and the insulator material comprises the other of dielectric nitride and dielectric oxide. As examples, one of the reactant source material and the insulator material comprises silicon dioxide and the other comprises silicon nitride. However, embodiments of the invention encompass the reactant source material and the insulator material each comprising like-materials, for example each comprising silicon dioxide or each comprising silicon nitride. As examples, where the reactant is one of oxygen or nitrogen, different techniques of deposition may result in slightly different silicon dioxides or silicon nitrides, respectively, wherein one more readily gives up oxygen or nitrogen, respectively, than does the other of silicon dioxide or silicon nitride, respectively. As examples with respect to silicon dioxide deposition, deposition techniques using ozone and tetraethylorthosilicate (TEOS), plasma and TEOS, spin-on-glass, or CVD using silane, may result in materials which more readily give up oxygen as compared to silicon dioxides using TEOS as a silicon dioxide deposition precursor in the absence of any ozone.

Regardless, in one embodiment, the reactant source material comprises a stoichiometric compound having a stoichiometric formula (e.g., one or both of $SiO_2$ and $Si_3N_4$). The reactant comprises an atom of the formula (e.g., O and/or N), and the reactant source material is deposited to comprise an excess of a stoichiometric amount of the atom in the formula. For example, silicon dioxide and/or silicon nitride may be deposited to have an excess of the stoichiometric amount of oxygen and nitrogen which may facilitate amount of reactant available for reaction with recording material 26.

Figure 4:
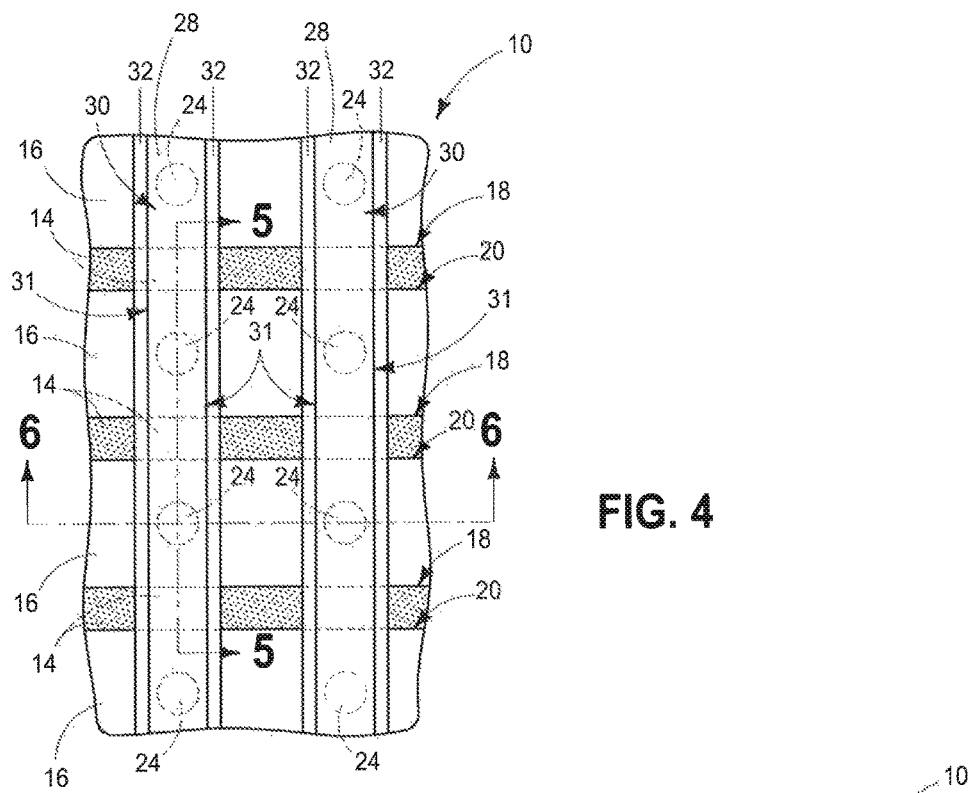
FIG. 4 is a diagrammatic top plan view of the FIG. 3 substrate at a processing step subsequent to that shown by FIG. 3.
Figure 5:
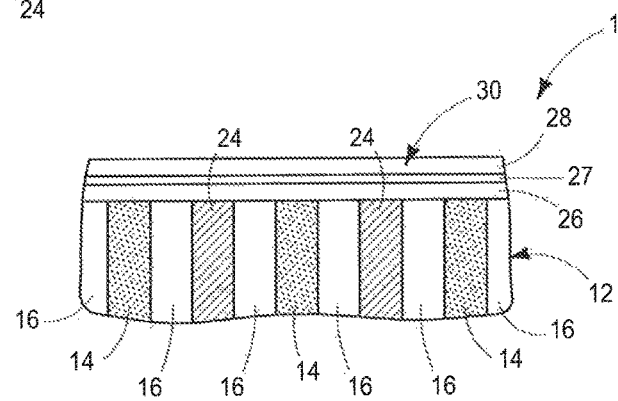
FIG. 5 is a sectional view taken through line 5-5 in FIG. 4.
Figure 6:
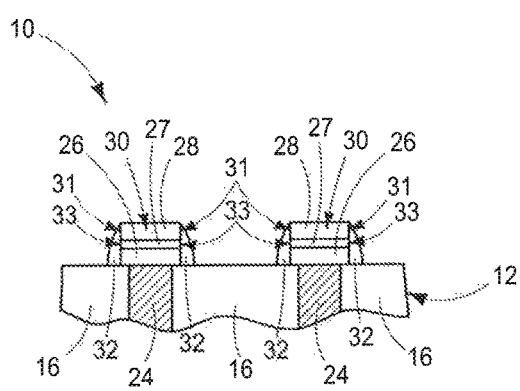
FIG. 6 is a sectional view taken through line 6-6 in FIG. 4.

Referring to FIGS. 4-6, reference material 28 has been patterned into a longitudinally elongated line 30 that passes over alternating outer regions 14, 16, and also as shown over conductive vias 24. An example patterning technique includes etching, for example using photolithographic patterning and etch through openings in masking material. The discussion proceeds with respect to fabrication relative to a single line 30, although likely multiple lines 30 will be formed with only two of such being shown in FIGS. 4-6. Regardless, a line 30 as formed may be other than straight-linear (not shown), for example being curvilinear and/or include a combination of straight and curved segments. In one embodiment and as shown, anisotropically etched sidewall spacers 32 (e.g., formed of one or both silicon dioxide and silicon nitride) have been formed over sidewalls 31 of line 30. In one embodiment, lines 18, 20 of alternating outer regions 14, 16, respectively, angle relative to line 30 of magnetic reference material 28, and in one embodiment as shown angle substantially perpendicularly relative thereto.

In one embodiment and as shown, non-magnetic material 27 has also been etched to be longitudinally elongated with and form part of longitudinally elongated line 30 of magnetic reference material 28. Further in one embodiment and as shown, magnetic recording material 26 has also been etched to be longitudinally elongated with and form a part of longitudinally elongated line 30 of magnetic reference material 28. However, in another embodiment, a method in accordance with the invention is devoid of etching of the recording material, with example such embodiments being further described below.

Figure 7:
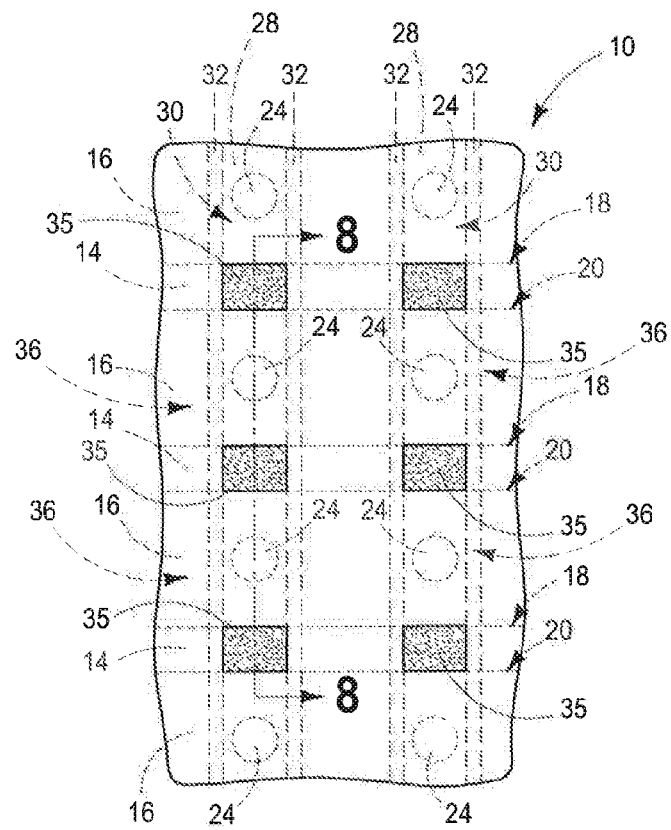
FIG. 7 is a diagrammatic top plan view of the FIG. 4 substrate at a processing step subsequent to that shown by FIG. 4.
Figure 8:
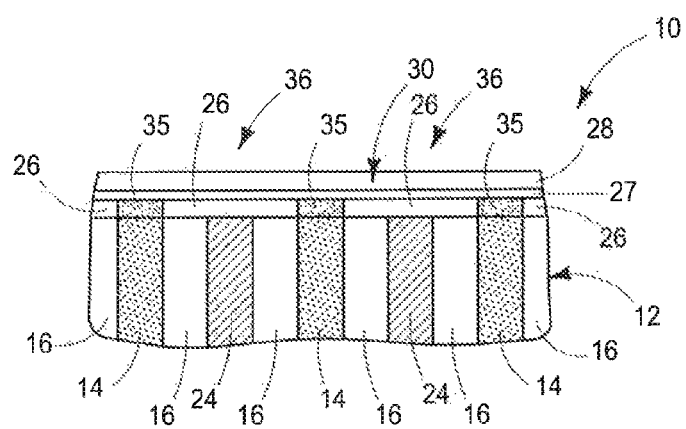
FIG. 8 is a sectional view taken through line 8-8 in FIG. 7.

Referring to FIGS. 7 and 8, recording material 26 has been subjected to the set of temperature and pressure conditions to react with the reactant of the reactant source material to form regions of dielectric material 35 which longitudinally alternate with recording material 26 along line 30 to form magnetic tunnel junctions 36 along line 30 which individually comprise recording material 26, non-magnetic material 27, and magnetic reference material 28 that are longitudinally between dielectric material regions 35. FIG. 7 is a diagrammatic top view corresponding to those of FIGS. 1 and 4, yet emphasizing position and outline only of dielectric material regions 35 in solid lines for clarity. In one embodiment and as shown, the reacting extends dielectric material regions 35 completely transversally through magnetic recording material 26. Further and accordingly in one embodiment and as-shown, recording material 26 is not elevationally over dielectric material regions 35 within line 30. Alternately but less-ideal, some of recording material 26 may be elevationally over dielectric material regions 35 (not shown).

FIGS. 7 and 8 depict an embodiment wherein the reacting to form dielectric material regions 35 occurs after the patterning to form line 30. Alternately, the reacting to form dielectric material regions 35 may occur before the patterning to form line 30, including for example the reacting occurring both before and after (even during) the act of patterning. Further when occurring before patterning, the reacting to form dielectric material regions 35 may occur spontaneously upon a deposition of recording material 26 directly against the reactant source material of outer regions 14. If occurring at least in part before patterning, the dielectric material may form entirely along lines 18 (not shown). If so, such might or might not be removed laterally outside the pattern of line 30.

Additional embodiments of a method of forming a line or lines of magnetic tunnel junctions are next described with reference to FIGS. 9-16 with respect to a substrate fragment 10*a*. Like numerals from the above-described embodiments have been used where appropriate, with some construction differences being indicated with the suffix "a" or with different numerals. Referring to FIGS. 9 and 10, substrate 12*a* comprises islands 40 of outer regions of insulator material (e.g., the same as insulator material of outer regions 16 in the above-described embodiments) within an expanse 42 of outer reactant source material (e.g., the same as source material of outer regions 14 in the above-described embodiments). In one embodiment and as shown, islands 40 and the reactant source material within expanse 42 form a repeating lattice-like pattern (albeit, in one embodiment as shown with parallelograms of islands 40 of insulator material being larger and of different shape than parallelogram-like shapes of the reactant source material between islands 40). In other embodiments, a lattice-like pattern may not be formed (not shown). For example, the islands may be formed at discrete locations not in a lattice-like pattern and/or not otherwise in a repeating pattern (not shown).

Referring to FIG. 11, magnetic recording material 26 has been formed over substrate 12*a*, non-magnetic material 27 has been formed over recording material 26, and magnetic reference material 28 has been formed over non-magnetic material 27.

Figure 12:
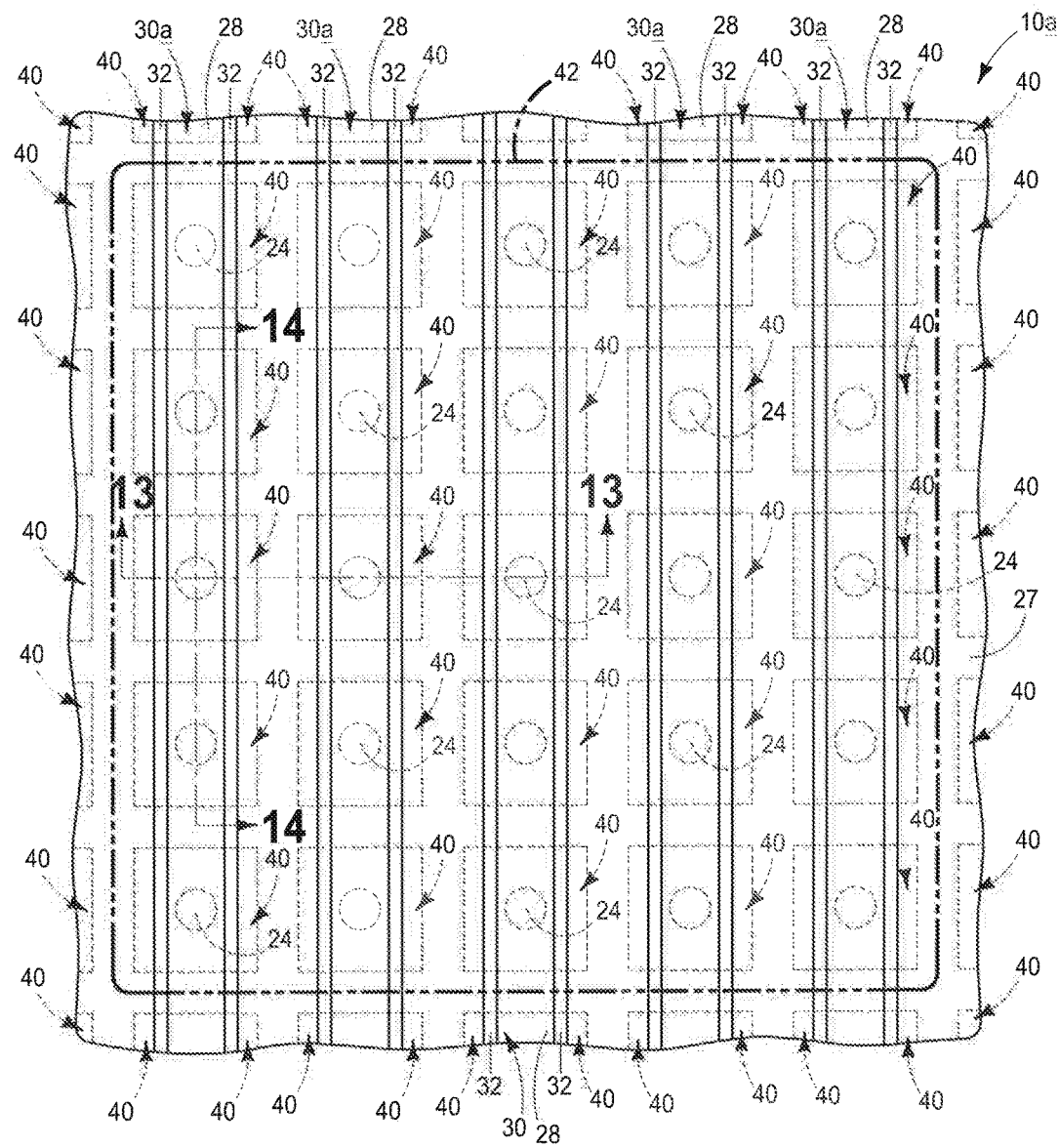
FIG. 12 is a diagrammatic top plan view of the FIG. 11 substrate at a processing step subsequent to that shown by FIG. 11.
Figure 13:
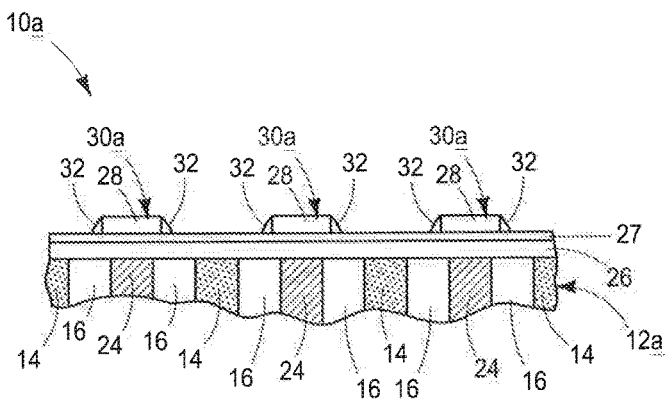
FIG. 13 is a sectional view taken through line 13-13 in FIG. 12.
Figure 14:
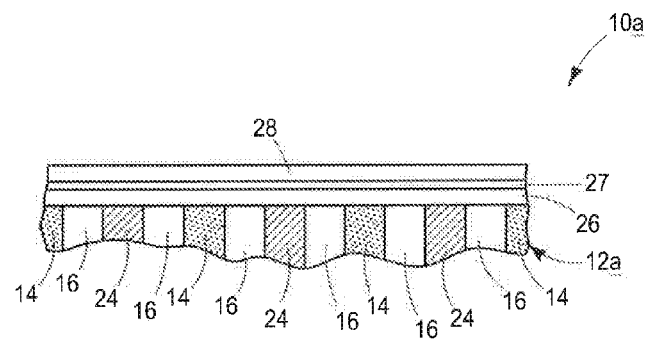
FIG. 14 is a sectional view taken through line 14-14 in FIG. 12.

Referring to FIGS. 12-14, reference material 28 has been patterned, in one embodiment by etching (e.g., using a lithographically patterned mask), to form a plurality of longitudinally elongated lines 30*a* that individually pass over respective pluralities of different ones of islands 40. In one embodiment and as shown, recording material 26 is not etched to form lines within expanse 42. Further, in one embodiment and as shown, non-magnetic material 27 is not etched to form lines within expanse 42, and in one embodiment comprises a layer that completely covers expanse 42 as-shown.

Figure 15:
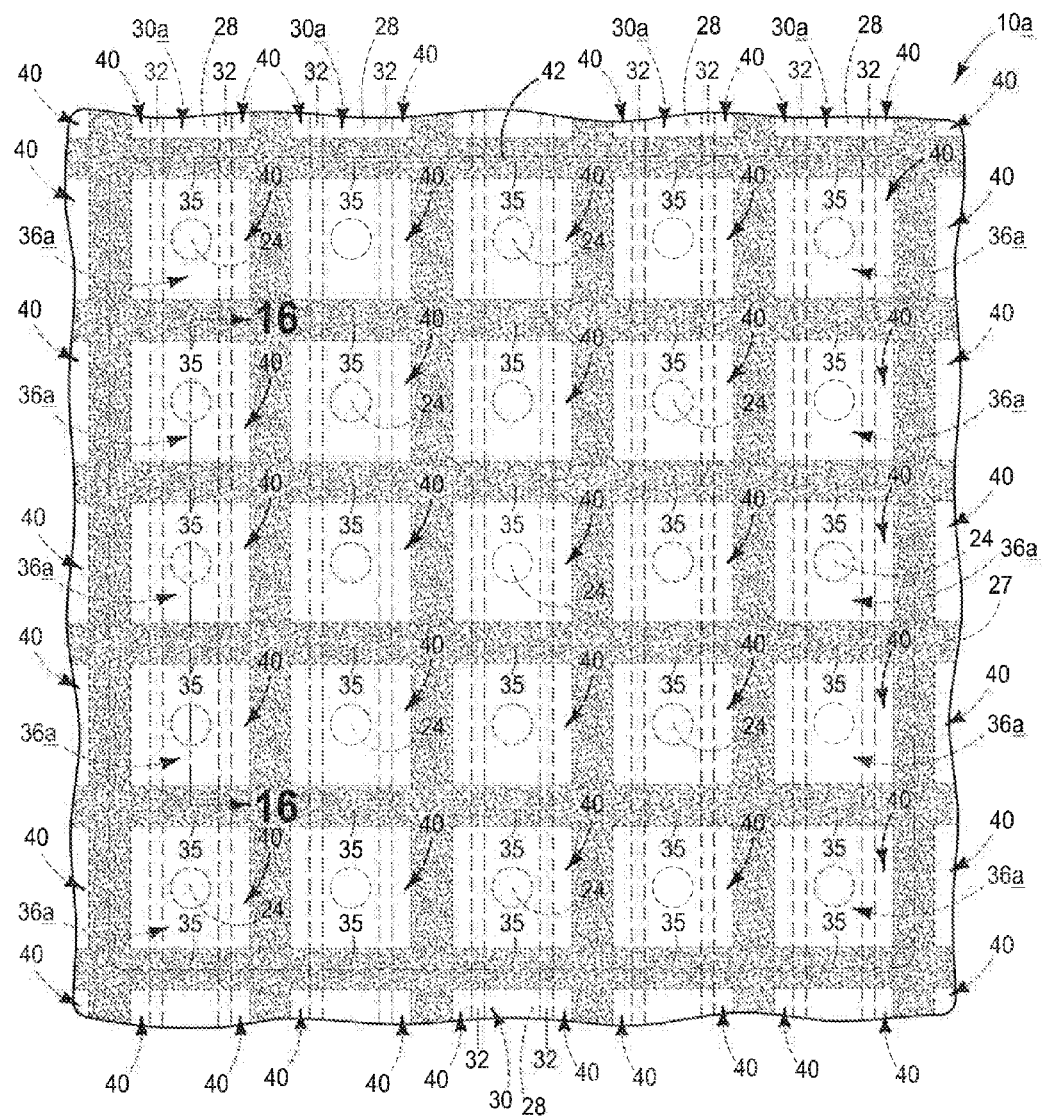
FIG. 15 is a diagrammatic top plan view of the FIG. 12 substrate at a processing step subsequent to that shown by FIG. 12.
Figure 16:
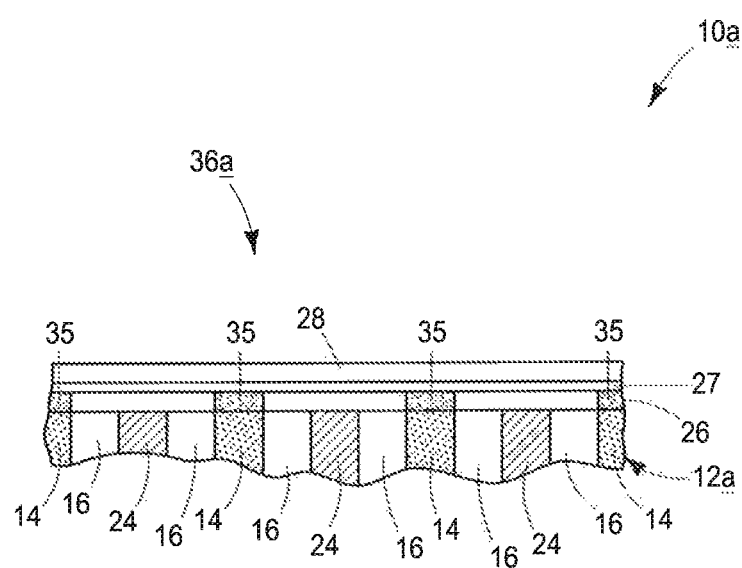
FIG. 16 is a sectional view taken through line 16-16 in FIG. 15.

Referring to FIGS. 15 and 16, recording material 26 has been subjected to the set of temperature and pressure conditions to react with the reactant of the reactant source material to form dielectric material regions 35 which longitudinally alternate with recording material 26 along individual of lines 30*a*. Such forms magnetic tunnel junctions 36*a* along individual lines 30 which individually comprise recording material 26, non-magnetic material 27, and reference material 28 that are longitudinally between dielectric material regions 35. Further as shown, the dielectric material formed from reaction of material 26 and that of outer regions 14 may form laterally outward of lines 30*a*, and in one embodiment may form continuously about islands 40.

Any other attribute as described above with respect to the embodiments of FIGS. 1-8 may be used or occur in the embodiments described with respect to FIGS. 9-16.

Embodiments of the invention also encompass a line of magnetic tunnel junctions independent of the method of manufacture. Nevertheless, a line of magnetic tunnel junctions may have any of the structural attributes as shown and described above with respect to FIGS. 1-16. Regardless, a line of magnetic tunnel junctions in accordance with embodiments of the invention comprises magnetic recording material (e.g., material 26) and magnetic reference material (e.g., material 28) having non-magnetic material (e.g., material 27) there-between. The reference material is longitudinally continuous along the line. For example, reference material 28 in each of the embodiments of FIGS. 7, 8 and FIGS. 15, 16 is longitudinally continuous along a line 30, 30*a*. The line comprises regions of dielectric material (i.e., regions 35) which longitudinally alternate with the recording material (e.g., material 26) along the line (e.g., lines 30, 30a). The magnetic tunnel junctions (e.g., junctions 36, 36a) individually comprise the recording material, the non-magnetic material, and the reference material that are longitudinally between the dielectric material regions along the line.

The non-magnetic material may be longitudinally continuous along the line, for example as is shown in each of the embodiments of FIGS. 7, 8 and FIGS. 15, 16. Further, the line may be considered as comprising laterally-outermost longitudinal edges, with the non-magnetic material not extending laterally beyond those edges. For example, such is shown in the embodiments of FIGS. 7, 8 but not in the embodiments of FIGS. 15, 16. In one embodiment, the non-magnetic material may comprise laterally-outermost longitudinal edges 33 which are laterally and longitudinally coincident with those of the line, for example as is shown in the embodiments of FIGS. 4-8 with respect to edges 31 and 33.

In one embodiment, the non-magnetic material may extend laterally beyond those longitudinal edges (e.g., the embodiments of FIGS. 15, 16). In one embodiment, the non-magnetic material comprises a layer that is continuous between immediately adjacent of lines of magnetic tunnel junctions in at least one cross-section (e.g., the embodiments of FIGS. 15, 16), and in one embodiment is laterally and longitudinally continuous between immediately adjacent lines along at least a majority of the longitudinal lengths of such lines (e.g., the embodiments of FIGS. 15, 16). In one embodiment the recording material is not longitudinally continuous along the line of magnetic tunnel junctions, for example as shown in each of the embodiments of FIGS. 7, 8 and FIGS. 15, 16.

CONCLUSION

In some embodiments, a method of forming a line of magnetic tunnel junctions comprises forming magnetic recording material over a substrate, non-magnetic material over the recording material, and magnetic reference material over the non-magnetic material. The substrate comprises alternating outer regions of reactant source material and insulator material along at least one cross-section. The reactant source material comprises a reactant that will react with the recording material to form dielectric material when subjected to a set of temperature and pressure conditions. The reference material is patterned into a longitudinally elongated line passing over the alternating outer regions. The recording material is subjected to the set of temperature and pressure conditions to react with the reactant of the reactant source material to form regions of the dielectric material which longitudinally alternate with the recording material along the line and to form magnetic tunnel junctions along the line which individually comprise the recording material, the non-magnetic material, and the reference material that are longitudinally between the dielectric material regions.

In some embodiments, a method of forming lines of magnetic tunnel junctions comprises forming magnetic recording material over a substrate, non-magnetic material over the recording material, and magnetic reference material over the non-magnetic material. The substrate comprises islands of outer regions of insulator material within an expanse of outer reactant source material. The reactant source material comprises a reactant that will react with the recording material to form dielectric material when subjected to a set of temperature and pressure conditions. The reference material is etched to form a plurality of longitudinally elongated lines of the reference material that individually pass over respective pluralities of different ones of the islands. The recording material is not etched to form lines within the expanse. The recording material is subjected to the set of temperature and pressure conditions to react with the reactant of the reactant source material to form regions of the dielectric material which longitudinally alternate with the recording material along individual of the lines and to form magnetic tunnel junctions along individual of the lines which individually comprise the recording material, the non-magnetic material, and the reference material that are longitudinally between the dielectric material regions.

In some embodiments, a line of magnetic tunnel junctions comprises magnetic recording material and magnetic reference material having non-magnetic material there-between. The reference material is longitudinally continuous along the line. The line comprises regions of dielectric material which longitudinally alternate with the recording material along the line. The magnetic tunnel junctions individually comprise the recording material, the non-magnetic material, and the reference material that are longitudinally between the dielectric material regions along the line.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A line of magnetic tunnel junctions, comprising:
   magnetic recording material and magnetic reference material having non-magnetic material there-between, the reference material being longitudinally continuous along the line;
   the line comprising regions of dielectric material which longitudinally alternate with the recording material along the line, the line comprising opposing laterally-outermost longitudinal edges defining opposite sides of and running along the line, the non-magnetic material not extending laterally beyond those longitudinal edges of the opposite sides; and
   the magnetic tunnel junctions individually comprising the recording material, the non-magnetic material, and the reference material that are longitudinally between the dielectric material regions along the line.

2. The line of magnetic tunnel junctions of claim 1 wherein the non-magnetic material is longitudinally continuous along the line.

3. The line of magnetic tunnel junctions of claim 1 wherein the non-magnetic material comprises laterally-outermost longitudinal edges on the opposite sides of the line and which are laterally and longitudinally coincident with the laterally-outermost longitudinal edges of the line.

4. The line of magnetic tunnel junctions of claim 1 wherein the recording material is not elevationally over the dielectric material regions within the line.

5. The line of magnetic tunnel junctions of claim 1 wherein the recording material is not longitudinally continuous along the line.

6. A line of magnetic tunnel junctions, comprising:
- magnetic recording material and magnetic reference material having non-magnetic material there-between, the reference material being longitudinally continuous along the line;
- the line comprising regions of dielectric material which longitudinally alternate with the recording material along the line;
- the magnetic tunnel junctions individually comprising the recording material, the non-magnetic material, and the reference material that are longitudinally between the dielectric material regions along the line; and
- wherein the line is elevationally over a substrate comprising alternating outer regions of different composition insulator materials in a cross-section extending longitudinally along and beneath the line, spaced conductive vias individually extending elevationally through one of the alternating insulator material compositions, the one composition comprising a pair of longitudinally-opposing regions directly against opposing longitudinal sides of individual of the vias, the regions of individual of the pairs collectively being wider in longitudinal direction along the cross-section than are individual of the alternating outer regions of the other composition in the longitudinal direction along the cross-section.

7. Memory integrated circuitry, comprising:
- a substrate comprising islands of elevationally outer regions of first composition insulator material within an expanse of an outer region of second composition insulator material which circumferentially surrounds individual of the islands and with the islands forms a lattice-like pattern, the second composition being different than the first composition;
- a conductive via within the individual islands; and
- a plurality of lines of magnetic tunnel junctions, individual of the lines of magnetic tunnel junctions extending longitudinally elevationally over a line of the conductive vias, the individual lines of magnetic tunnel junctions comprising:
  - magnetic recording material and magnetic reference material having non-magnetic material there-between, the reference material being longitudinally continuous along the line of magnetic tunnel junctions;
  - the line of magnetic tunnel junctions comprising regions of dielectric material which longitudinally alternate with the recording material along the line of magnetic tunnel junctions;
  - the magnetic tunnel junctions individually comprising the recording material, the non-magnetic material, and the reference material that are longitudinally between the dielectric material regions along the line of magnetic tunnel junctions; and
  - the recording material of individual of the magnetic tunnel junctions being electrically coupled with one of the conductive vias along the line of conductive vias.

8. The circuitry of claim 7 wherein the non-magnetic material that is between the magnetic recording material and the magnetic reference material comprises a layer that is continuous between immediately adjacent of said plurality of lines of magnetic tunnel junctions in at least one cross-section.

* * * * *